United States Patent [19]

Ludwig

[11] Patent Number: 5,115,150
[45] Date of Patent: May 19, 1992

[54] LOW POWER CMOS BUS RECEIVER WITH SMALL SETUP TIME

[75] Inventor: Mark A. Ludwig, Loveland, Colo.

[73] Assignee: Hewlett-Packard Co., Palo Alto, Calif.

[21] Appl. No.: 615,681

[22] Filed: Nov. 19, 1990

[51] Int. Cl.⁵ .................. H03K 19/092; H03K 19/096
[52] U.S. Cl. .................................. 307/475; 307/452; 307/481
[58] Field of Search ............... 307/452, 475, 480, 481, 307/270

[56] References Cited

U.S. PATENT DOCUMENTS

| | | | |
|---|---|---|---|
| 3,737,673 | 6/1973 | Suzuki | 307/452 |
| 3,862,440 | 1/1975 | Suzuki et al. | 307/452 |
| 4,698,526 | 10/1987 | Allan | 307/475 |
| 4,849,658 | 7/1989 | Iwamura et al. | 307/443 |
| 4,954,731 | 9/1990 | Dhong et al. | 307/452 |

Primary Examiner—Edward P. Westin
Assistant Examiner—Richard Roseen

[57] ABSTRACT

A complementary metal oxide semiconductor (CMOS) inverter circuit wherein the complementary PFET is replaced by a small CMOS inverter and an NFET having a size substantially the same as that of the complementary NFET. By so adding the small CMOS inverter and changing the complementary PFET to an NFET, power may be reduced and speed increased. Such an inverter is preferably used in a latching bus receiver to reduce setup time. This is made possible due to the characteristics of an NFET relative to those of a PFET, namely, that the NFET changes logic level much more quickly than a correspondingly sized PFET. These circuits may also be used for decreasing the high to low and low to high setup times for latching purposes. A faster input to output latching speed is thus made possible without increasing the power even for heavily loaded outputs, and all of this may be done with a similar utilization of chip area.

7 Claims, 4 Drawing Sheets

LOW POWER CMOS BUS RECEIVER WITH SMALL SETUP TIME

BACKGROUND OF THE INVENTION

1. Field of the Invention

The present invention relates to a low power CMOS bus receiver with small setup time, and more particularly, to a latching CMOS bus receiver comprised of CMOS inverters which allow fast latching with less power and less chip area by replacing the complementary PFETs of the CMOS inverters with NFETs and smaller CMOS inverters having faster rise times.

2. Description of the Prior Art

Metal oxide semiconductor (MOS) circuits have been used in a wide variety of applications. One simple application includes use of MOS transistors in an inverter circuit. A typical MOS inverter circuit comprises one or more FETs connected across a power supply with an input at a gate of one of the FETs. Such inverter circuits typically have a resistor or some other passive element for providing a "pull-up"0 function for a high output. However, such circuits are not advantageous for low power applications because the "pull-up" resistance always draws power from the power supply regardless of the output logic state. Accordingly, for low power applications, complementary metal oxide semiconductor (CMOS) circuits have been developed.

CMOS inverters generally use insulated-gate FETs in the enhancement mode, with P-channel and N-channel FETs (PFETs and NFETs) in series across the power supply and having a common gate input. In an NFET, a positive gate-to-source voltage greater than a threshold value will increase the channel current. With the gate at source potential, the channel is cut off. On the other hand, for a PFET, a gate negative to the source increases the channel current, and a gate at source potential cuts off the channel. Thus, when the input to the CMOS inverter is given a logic 0 signal, at ground, the NFET is cut off and the PFET, with its gate negative to its source at the power supply voltage is turned on. There is thus a low resistance path through the PFET and an open circuit at the NFET. The output voltage is thus a logic 1 and is typically equal to the power supply voltage. However, when the input voltage is a logic 1 or equal to the power supply voltage, the NFET conducts and becomes a low resistance and the PFET is cut off. The output voltage is essentially 0, or logic 0. The resulting circuit thus operates as an inverter.

The PFETs and NFETs in such an inverter are complementary in that the transition time from a 0 to a 1 logic value is approximately equal to the transition time from a 1 to a 0 logic value. Such circuits are used in a variety of applications, particularly low power applications, for no power needs to be applied to the circuit except during a switching time interval This is because the "pull-up" PFET can be turned off when no switching is taking place, thereby limiting power consumption. A known use of such CMOS inverters is in data bus receivers.

FIG. 1 illustrates a prior art CMOS data bus receiver comprising CMOS inverter circuits for receiving TTL level signals from the input IN of an integrated circuit chip, latching the signal by removing the input clock CK and driving the latched signal onto a bus for access to internal paths of the integrated circuit while the clock CK is asserted. As shown in FIG. 1, such a bus receiver comprises complementary NFET 104 and PFET 106 responsive to differential clock signals CK and NCK received from NFET 102 and the combination of PFET 108 and inverter 110, respectively As is well known by those skilled in the art, TTL level signals having voltages greater than approximately 2.0V are defined as "high" or of a "1" logic level, whereas TTL level signals having voltages less than approximately 0.8V are defined as "low" or of a "0" logic level. Typically, this "low" level is above the turn-on voltage of NFETs 102 and 104, and likewise, the "high" level is sufficient to turn on PFETs 106 and 108. Thus, for the circuit of FIG. 1, under typical worst case input voltage conditions power is consumed in the input stage comprising FETs 102-108. The output of the CMOS inverter formed by complementary NFET 104 and PFET 106 is then latched using a feedback latching circuit comprising inverters 112 and 114, and the latched output is then selectively applied to an output bus by driver 116 in accordance with a bus control signal DRVCK which resolves conflicts for bus accesses by the CMOS receiver.

The response characteristic of the CMOS bus receiver of FIG. 1 is dependent upon the characteristics of the NFET 104 and the PFET 106. As is known by those skilled in the art, PFETs have lower driving capabilities than NFETs of the same size. As a result, PFET 106 typically has a size which is approximately twice that of NFET 104 so that the time duration of the pull-up by PFET 106 corresponds to the time duration of the pull-down by NFET 104. In other words, in CMOS inverter circuits the PFETs are typically quite a bit larger than their complementary NFETs because PFETs typically require more time to charge and discharge than similarly sized NFETs. Thus, to provide a CMOS inverter circuit with complementary rise and decay times, the PFET must be approximately twice as large as the complementary NFET. The resulting inverter thus takes up a relatively large chip area for the amount of power dissipated. Moreover, the speed of a latching bus receiver of the type shown in FIG. 1 is generally limited by the pull-up speed of the PFET 106 and the setup time of the latching circuit.

Accordingly, it is desirable to develop a bus receiver which minimizes the pull-up time of the PFETs and the setup time of the latching circuit while also decreasing power dissipation per unit of chip area in a VLSI implementation of the bus receiver. The CMOS bus receiver and inverter circuit of the invention have been designed to meet these needs.

SUMMARY OF THE INVENTION

The present invention solves the above-mentioned problems of the prior art by providing a CMOS bus receiver which requires little setup time for latching inputs before providing an input signal to an output bus and which minimizes the pull-up time of the PFETs of its inverter circuits. In particular, the present invention is based upon the inventor's recognition that the complementary PFETs of the CMOS inverters may be replaced by NFETs having a size approximate to that of the NFET complementary to the replaced PFET and relatively small CMOS inverters disposed at an input to the NFETs replacing the PFETs. Then, by appropriate selection of FET sizes for the small CMOS inverters at the inputs to the NFETs replacing the PFETs, the NFETs replacing the PFETs may be turned off under most conditions of high input voltages and processed circuit parameters while maintaining small currents for low input voltages. Also, by so replacing a complementary PFET with an NFET and a small CMOS inverter, power to the bus receiver may be reduced, the speed of latching may be increased due to the faster response time of the NFET relative to that of its complementary PFET, and the overall chip area for the circuit may be reduced.

Accordingly, the present invention relates to a latching CMOS bus receiver which provides high speed switching and latching Such a circuit in accordance with the invention preferably comprises a CMOS inverter responsive to a clock signal for inverting a logic state of an input signal during a predetermined clock state of the clock signal. The CMOS inverter of the invention comprises a series connection of a first NFET transistor and a second NFET transistor having a small CMOS inverter at an input gate thereof. These elements are then disposed such that the input signal is received at an input of the small CMOS inverter and a gate of the first NFET transistor. Feedback means then latch the inverted input signal output by the CMOS inverter, and means responsive to a latched output of the feedback means drives the latched signal onto an output bus.

In accordance with preferred embodiments of the invention, the driving means preferably comprises parallel CMOS inverters which are responsive to a bus access signal, and an NFET having a gate connected to an output of one of the parallel CMOS inverters, a source connected to a voltage source, and a drain connected to an output of the other of the parallel CMOS inverters and an output of the driving means. As a result of this arrangement, the low to high transition time of the circuit may be made quite short. Also, the feedback latching means is preferably responsive to an output of the small CMOS inverter of the CMOS inverter as well as the clock signal for minimizing setup time for latching of the inverted input signal The switching properties of the invention are best achieved when the width/length ratios of the first and second NFET transistors are approximately equal. The invention also provides improved switching when the output bus has a capacitive load of at least around 3 pF.

The invention also comprises a CMOS inverter connected across a power supply and having a small setup time. Such a CMOS inverter in accordance with the invention comprises a PFET and an NFET in series connection across the power supply and having a common gate input and a common output at a connection point between a drain of the PFET and a source of the NFET. The CMOS inverter is characterized by the inclusion of an additional NFET having a source connected to the power supply and a drain connected to the common output and an additional CMOS inverter connected between the common gate input and a gate of the additional NFET. Preferably, this additional CMOS inverter comprises a small PFET and small NFET whereby the sum of a width/length ratio of the PFET, the additional NFET, the small PFET and small NFET is less than a width/length ratio of a PFET complementary to the NFET of the CMOS inverter yet provide the CMOS inverter with rise and decay times which are substantially equal. A preferred embodiment of the invention is best utilized when the common output drives a load having a capacitance of at least around 3 pF. Also, chip area may be saved by designing the NFET and the additional NFET to have width/length ratios which are approximately equal.

BRIEF DESCRIPTION OF THE DRAWINGS

The above and other objects and advantages of the invention will become more apparent and more readily appreciated from the following detailed description of the presently preferred exemplary embodiments of the invention taken in conjunction with the accompanying drawings, of which.

DETAILED DESCRIPTION OF THE PRESENTLY PREFERRED EMBODIMENTS

Preferred embodiments of the invention will now be described with reference to FIGS. 2-6 wherein like numerals designate like elements. It will be appreciated by those of ordinary skill in the art that the description given herein with respect to those figures is for exemplary purposes only and is not intended in any way to limit the scope of the invention. All questions regarding the scope of the invention may be resolved by referring to the appended claims.

Figure 1:
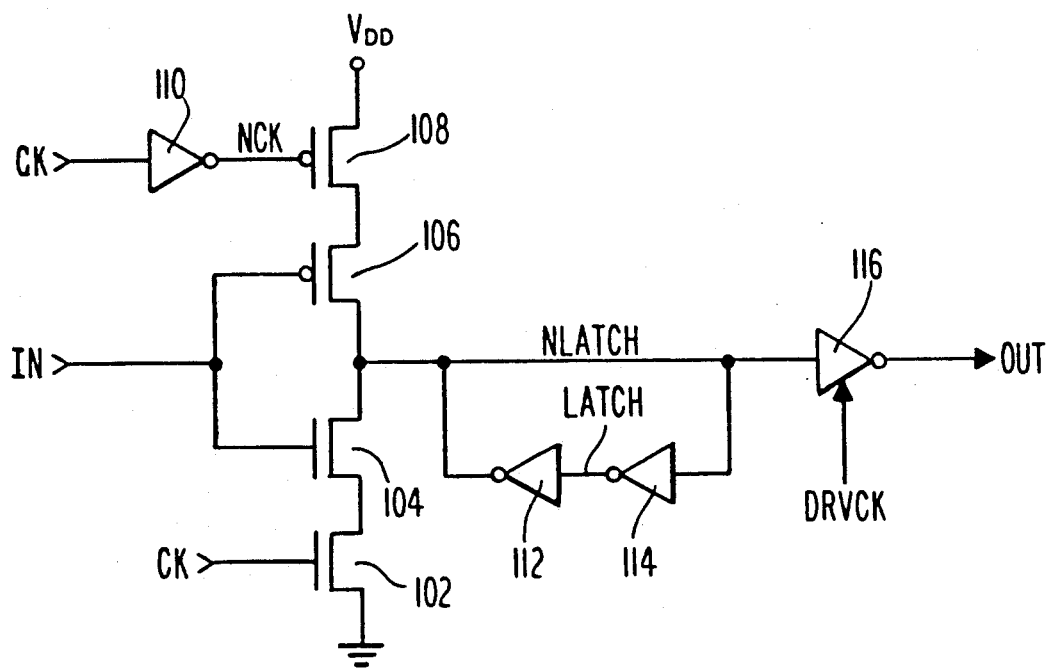
FIG. 1 is a simplified circuit diagram of a prior art CMOS bus receiver.
Figure 2:
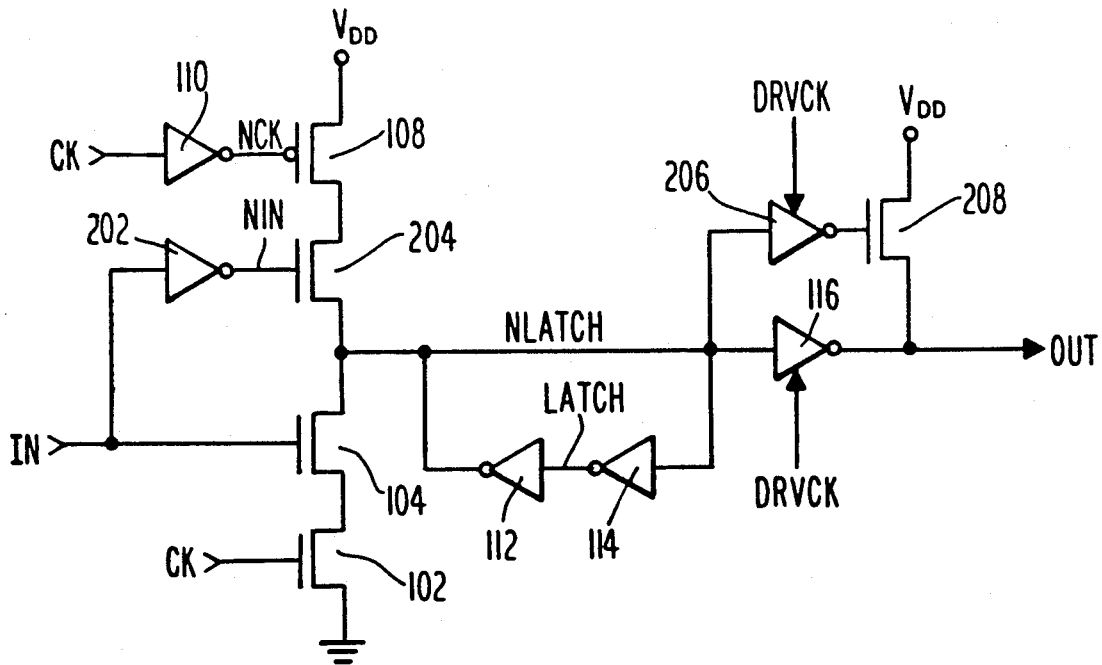
FIG. 2 is a simplified circuit diagram of a low power CMOS bus receiver with small setup time in accordance with a first embodiment of the invention.

FIG. 2 illustrates a first embodiment of the invention in which PFET 106 of the prior art circuit of FIG. 1 is replaced by a relatively small CMOS inverter 202 and NFET 204. By so replacing PFET 106 with inverter 202 and NFET 204, power consumption and setup time for creating NLATCH is reduced while switching speed is increased. The reasons for this improvement will be apparent from the following description.

The embodiment of FIG. 2 further differs the prior art circuit of FIG. 1 in that the output driver further comprises a small CMOS inverter 206 responsive to the bus control signal DRVCK and an NFET 208 responsive to an output of inverter 206 at a gate thereof and which is connected between the power source and the output to the bus. Inverter 206 and NFET 208 generally improve the low to high pull-up time at the output and reduce the load on node NLATCH. This is so because while PFETs are capable of driving a node to the power supply voltage $V_{DD}$, they do it slowly through the switching level of the succeeding gates as compared to an NFET driven by the inversion of the driving signal. Accordingly, by adding inverter 206 and NFET 208, the load on node NLATCH may be reduced while increasing the low to high switching speed of the output. This is the same principle upon which the inverter comprising NFETs 104 and 204 and small inverter 202 improves switching speed. Such a circuit enables the PFETs in inverter 116 and inverter 112 to bring their outputs completely to the power supply voltage $V_{DD}$ while the circuits connected to the bus are responding to the changed logic level which is quickly provided to them by the receiver of FIG. 2.

The present inventor has discovered that by replacing a complementary PFET of a CMOS inverter with a small CMOS inverter such as 202 or 206 and an NFET such as 204 or 208, setup time for latching may be reduced without losing the complementary nature of the CMOS circuit. In other words, since in CMOS inverter circuits the PFETs must typically be substantially larger than their corresponding NFETs in order to provide matched rise and fall times, switching speed is improved in accordance with the invention by replacing the PFET with an NFET for switching while retaining pull-up PFETs at the output for bringing the output voltage up to the power supply voltage level. This is accomplished in accordance with the present invention by making NFET 204 approximately equal in size to NFET 104 and making NFET 208 approximately equal in size to the NFET of CMOS inverter 116 while using substantially smaller CMOS inverter circuits 202 and 206. The size of these relatively small CMOS inverter circuits are dependent upon the circuit requirements and are left to the discretion of those skilled in the art. Sample sizes in the form of width-/length ratios are set forth below in the description of FIG. 5.

Thus, in accordance with the embodiment of FIG. 2, the relatively slow to charge PFET 106 of the prior art CMOS inverter is replaced by a relatively fast to charge NFET 204 and a relatively small inverter circuit 202 connected to the gate of the NFET 204 for providing the pull-up function of the replaced PFET. Such circuits when provided across the output bus driver also improve the speed of low to high transitions on the output to the bus. The inverter of the invention works best for large capacitive loads on the bus, preferably at least on the order of 3 pF. The invention is thus preferably used when relatively high capacitive loads are present on the bus and functions to minimize power dissipated for the same amount of speed, or conversely, to maximize speed for a given amount of power.

Figure 3:
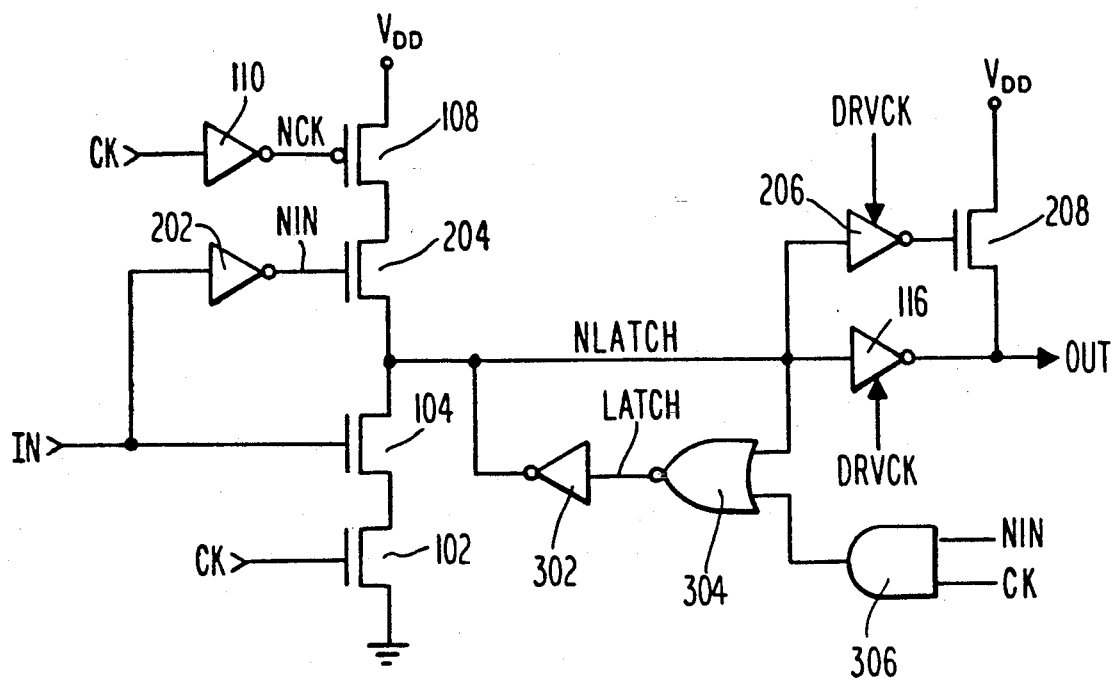
FIG. 3 is a simplified circuit diagram of a low power CMOS bus receiver with small setup time in accordance with a second embodiment of the invention in which high to low setup is improved by adding an "AND" and "NOR" gate to the latching circuit.

FIG. 3 illustrates another embodiment of the invention in which the feedback latching circuit of the embodiment of FIG. 2 is replaced by inverter circuit 302, NOR gate 304 and AND gate 306. Adding AND gate 306 and NOR gate 304 improves the high to low setup time of the output of the bus receiver by using the output NIN of inverter 202 instead of NLATCH to begin setup. NIN function as a set/reset for the feedback instead of NLATCH since NIN gets to its threshold before NLATCH starts (FIG. 6(e)). Setup is completed sooner since NLATCH follows NIN on a low to high transition and thus affects LATCH more slowly than in the basic CMOS bus receiver of the type shown in FIG. 1. As a result, by replacing inverter gates 112 and 114 of the embodiment of FIG. 2 with a combination of an inverter gate 302, a NOR gate 304 and an AND gate 306 responsive to NIN, setup may be completed faster relative to the latching clock CK, and accordingly, latching may be completed sooner.

Figure 4:
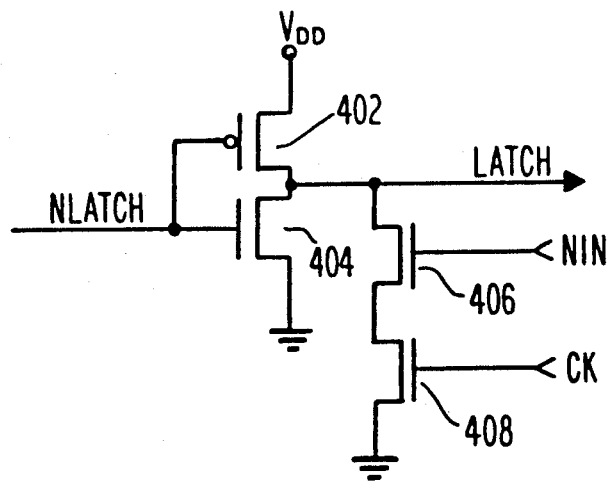
FIG. 4 illustrates a preferred embodiment of the latching circuit of the embodiment of FIG. 3.

FIG. 4 illustrates a detailed schematic diagram of the feedback circuit of FIG. 3. As shown, inverter 302, NOR gate 304 and AND gate 306 may be implemented as a complementary CMOS inverter comprising PFET 402 and NFET 404 and the series connection of NFETs 406 and 408 responsive to NIN and the clocking signal CK, respectively. As just noted, by making the latching responsive to NIN, a fast setup relative to the latching clock CK may be achieved for a heavily loaded bus with a similar utilization of chip area.

Figure 5:
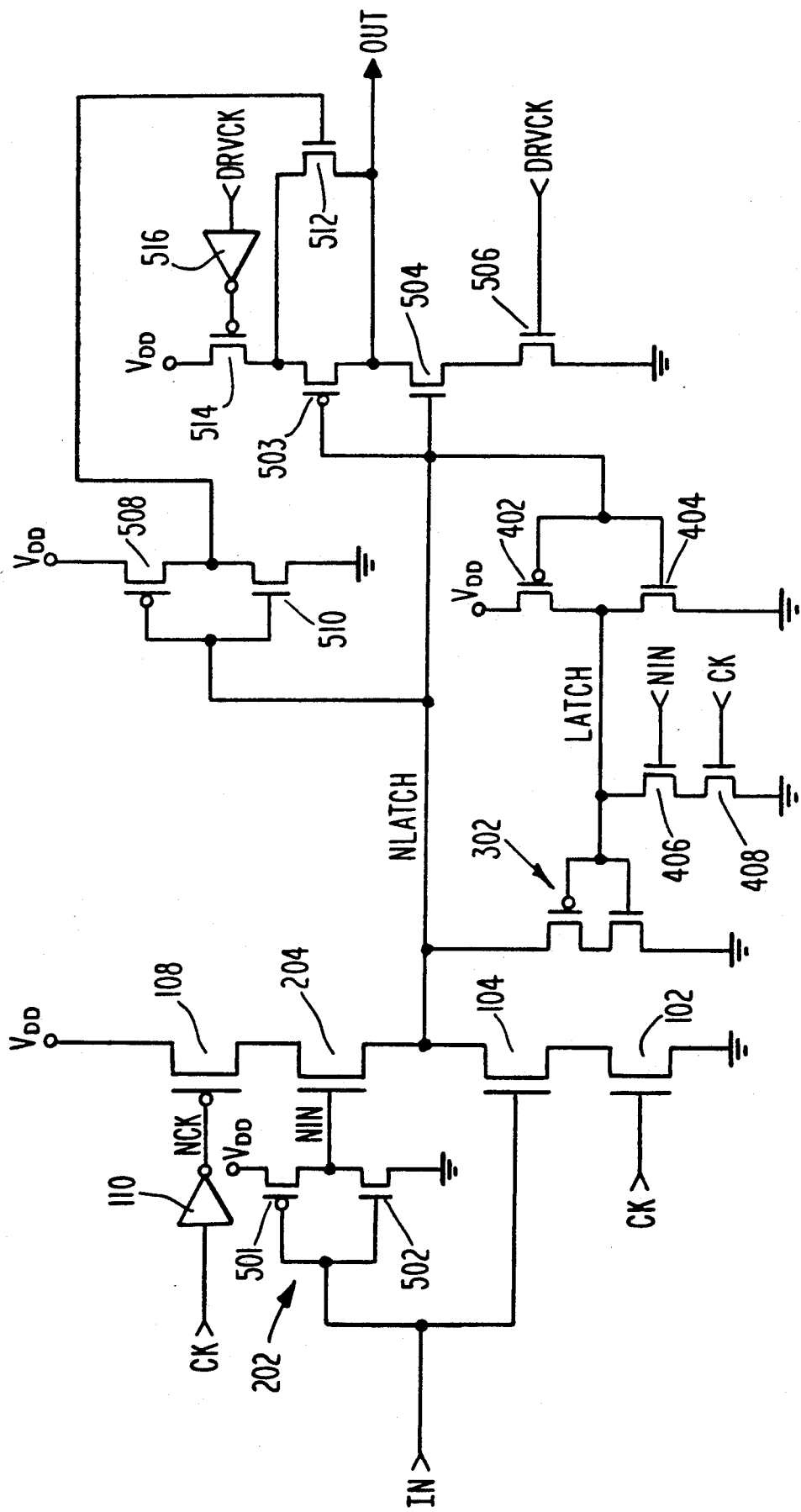
FIG. 5 illustrates a detailed circuit diagram of the embodiment of FIG. 3.

FIG. 5 illustrates a detailed circuit diagram of the embodiment of FIG. 3 in which the elements are replaced by their corresponding PFETs and NFETs. As shown, inverter 202 is comprised of PFET 501 and NFET 502, while the driving circuit is comprised of PFET 503, NFET 504, NFET 506, PFET 508, NFET 510, NFET 512, PFET 514 and driving inverter 516, which is responsive to bus access signal DRVCK. In a preferred embodiment of the invention, the circuit elements of FIG. 5 have the following width/length ratios: NFET 102=61; NFET 104=61; PFET 501=12; NFET 502=20; NFET 204=58; PFET 108=50; NFET of inverter 302=2.4; PFET of inverter 302=6.2; NFET 406=NFET 408=4; PFET 402=5.2; NFET 404=1.6; NFET 510=3.5; PFET 508=13.6; PFET 503=27; PFET 514=150; NFET 504=NFET 512=97; and NFET 506=150. Such a circuit in accordance with the invention has a setup time of approximately 0.8 ns before the fall of CK and a hold time of approximately 0.5 ns after the fall of CK. Such a circuit thus has an overall delay time of approximately 2.05 ns for a load on the output bus having a capacitance of approximately 3 pF. Also, the resulting circuit takes up less chip area than a prior art CMOS inverter with a comparable response since the NFET and small inverter replacing the complementary PFET can be made to require less chip area.

Figure 6:
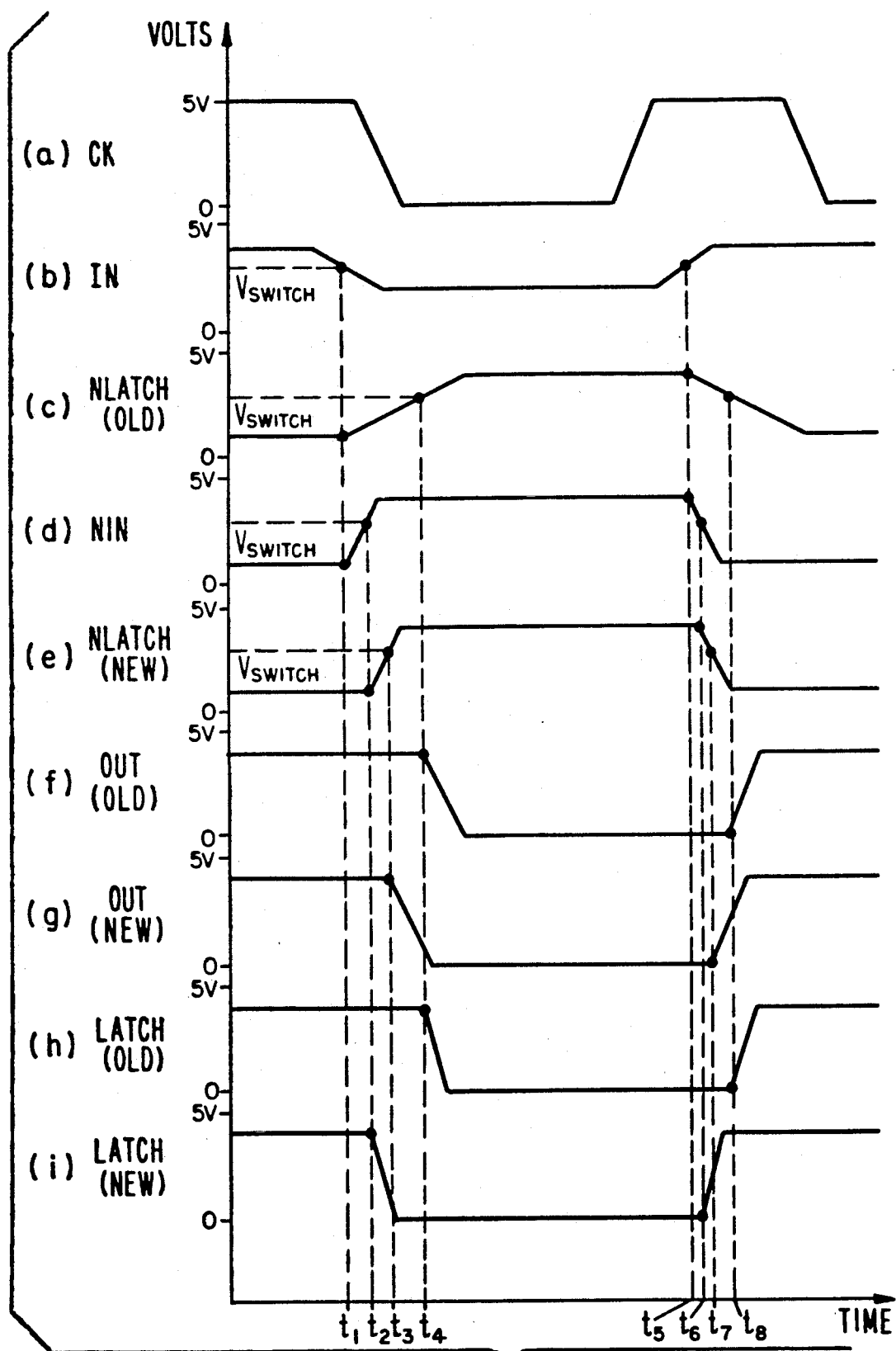
FIGS. 6(a)-(i) illustrate timing diagrams for describing the operation of the CMOS bus receiver in accordance with the embodiments of FIGS. 2 and 3.

FIGS. 6 (a)-(i) illustrate timing diagrams for explaining the operation of the invention. FIG. 6(a) illustrates clocking signl CK, while FIG. 6(b) represents an input signal IN having a 3.5 ns switching speed, for example. In the prior art embodiment of FIG. 1, when such an input signal falls through or rises through a switching voltage $V_{SWITCH}$, the signal NLATCH begins to ramp up or down as shown in FIG. 6(c). Then, when NLATCH reaches the switching voltage $V_{SWITCH}$, the output OUT and LATCH begin ramping up or down as shown in FIGS. 6(f) and (h). Such a switching system is relatively slow for the reasons set forth above and has a potential race problem between latching signal LATCH and the clock signal CK, which would destroy the received value.

By contrast, the latching in accordance with the present invention is responsive to the output signal NIN of inverter 202, which gets to $V_{SWITCH}$ before NLATCH even starts. In other words, as shown in FIGS. 6(d) and (e), NLATCH in accordance with the present invention does not begin to ramp up or down until NIN reaches $V_{SWITCH}$. However, NLATCH still reaches its threshold voltage $V_{SWITCH}$ faster than in the prior art given that faster switching NFETs are used (compare FIGS. 6(c) and (e)). The output OUT as shown in FIG. 6(g) thus begins to change state sooner than in the prior art bus receiver of FIG. 1, for example. Moreover, since the latch signal LATCH is made responsive to NIN, which completely changes state before the output OUT begins to change, race conditions are thereby avoided in accordance with the invention. Furthermore, by pulling down the LATCH signal early, the circuit need not wait for setup and thus decreases the latching time.

Preferably, NLATCH starts up when NIN is $V_{TN}$ greater than NLATCH, where $V_{TN}$ is smaller than the switching voltage, which for CMOS typically equals 0.8 V. NIN thus must remain within a $V_{TN}$ difference of NLATCH. Also, so that rising and falling switching speeds may be about the same, the PFETs and NFETs are chosen so that the output response is approximately the same as with the complementary PFET and NFET as in the embodiment of prior art FIG. 1.

The present invention thus maintains the functions of the prior art circuitry except that the switching occurs quicker and sooner without increasing the power. Moreover, since the latch signal LATCH and the latch signal NLATCH switch at approximately the same time, no race conditions occur in accordance with the present invention. Also, since the PFETs are smaller, switching speed is substantially improved without increasing chip area.

Those skilled in the art will readily appreciate that many modifications to the invention are possible within the scope of the invention. Accordingly, the scope of the invention is not intended to be limited by the preferred embodiments described above, but only by the appended claims.

I claim:

1. A latching CMOS bus receiver, comprising:
a CMOS inverter responsive to a clock signal for inverting a logic state of an input signal during a predetermined clock state of said clock signal, said CMOS inverter comprising a series connection of a first NFET transistor and a second NFET transistor having a small CMOS inverter at an input gate thereof, said input signal being received at an input of said small CMOS inverter and a gate of said first NFET transistor and being inverted at an output of said CMOS inverter at common node between said first and second series connected NFET transistors;
feedback means for latching the inverted input signal output by said CMOS inverter; and
means responsive to a latched output of said feedback means for driving the input signal onto an output bus, said driving means comprising first and second driving CMOS inverters which receive said latched output of said feedback means and a bus access signal, and an NFET having a gate connected to an output of said first driving CMOS inverter, a source connected to a voltage source, and a drain connected to an output of said second driving CMOS inverter and said output bus.

2. A receiver as in claim 1, wherein said feedback latching means is responsive to an output of said small CMOS inverter of said CMOS inverter and said clock signal for minimizing setup time for latching of said inverted input signal.

3. A receiver as in claim 1, wherein said output bus has a capacitive load of at least around 3 pF.

4. A receiver as in claim 1, wherein the width/length ratios of said first and second NFET transistors are approximately equal.

5. A CMOS driver connected across a power supply and having a small setup time, comprising:
a PFET and an NFET in series connection across said power supply and having a common gate input and a common output at a connection point between a drain of said PFET and a source of said NFET;
an additional NFET having a source connected to said power supply and a drain connected to said common output; and
an additional CMOS inverter connected between said common gate input and a gate of said additional NFET, said additional CMOS inverter comprising a small PFET and small NFET, whereby the sum of a width/length ratio of said PFET, said additional NFET, said small PFET and small NFET is less than a width/length ratio of a PFET complementary to said NFET yet said CMOS inverter has rise and decay times which are substantially equal.

6. A CMOS driver as in claim 5, wherein said common output drives a load having a capacitance of at least around 3 pF.

7. A CMOS driver as in claim 5, wherein said NFET and said additional NFET have width/length ratios which are approximately equal.

* * * * *